United States Patent [19]

Sakakibara

[11] Patent Number: 5,418,754
[45] Date of Patent: May 23, 1995

[54] DYNAMIC RANDOM ACCESS MEMORY DEVICE WITH SELF-REFRESH CYCLE TIME DIRECTLY MEASURABLE AT DATA PIN

[75] Inventor: Kenichi Sakakibara, Tokyo, Japan
[73] Assignee: NEC Corporation, Tokyo, Japan
[21] Appl. No.: 194,519
[22] Filed: Feb. 10, 1994
[30] Foreign Application Priority Data
Feb. 10, 1993 [JP] Japan .................. 5-045906
[51] Int. Cl.⁶ .............. G11C 11/406; G11C 11/403
[52] U.S. Cl. .................. 365/222; 365/201;
365/189.01; 365/239; 365/189.08
[58] Field of Search .......... 365/222, 201, 189.01,
365/189.08, 189.04, 221, 230.06, 239

[56] References Cited

U.S. PATENT DOCUMENTS 5,146,430 9/1992 Torimaru et al. .............. 365/230.02
5,315,557 5/1994 Kim et al. .................... 365/222
5,317,709 5/1994 Sugimoto .................... 365/222

FOREIGN PATENT DOCUMENTS 2-105389 4/1990 Japan .

Primary Examiner—Joseph A. Popek
Assistant Examiner—Huan Hoang
Attorney, Agent, or Firm—Sughrue, Mion, Zinn, Macpeak & Seas

[57] ABSTRACT

A dynamic random access memory device enters into a self-refresh mode in response to a CAS-before-RAS sequence, and a controller incorporated in the dynamic random access memory device deactivates a column addressing system and a data output system in the self-refresh mode for decreasing a current consumption, wherein the controller is responsive to an external test control signal for temporally activating the column addressing system and the data output system, and a self-refresh cycle time is directly measured at a data output pin.

8 Claims, 11 Drawing Sheets

DYNAMIC RANDOM ACCESS MEMORY DEVICE WITH SELF-REFRESH CYCLE TIME DIRECTLY MEASURABLE AT DATA PIN

FIELD OF THE INVENTION

This invention relates to a dynamic random access memory device and, more particularly, to a dynamic random access memory device with a CAS(Column Address Strobe signal)-before-RAS(Row Address Strobe signal) self-refreshing mode.

DESCRIPTION OF THE RELATED ARTS

A typical example of a refresh controlling system incorporated in the dynamic random access memory device is illustrated in FIG. 1 of the drawings, and is associated with a timing controlling system 1 also incorporated in the dynamic random access memory device. The dynamic random access memory device selectively enters into a self-refreshing mode for refreshing stored data bits and into a standard data access mode for a write-in and a read-out.

The refresh controlling system 2 comprises a discriminator 2a for entry into a self-refresh and a controller 2b for the self-refresh. The discriminator 2a and the controller 2b cooperate with a controller 1a for a row addressing, a controller 1b for a column addressing and a controller 1c for a sense amplification, and these controllers 1a to 1c form parts of the timing controlling system 1.

A row address strobe signal RAS is supplied in parallel to the discriminator 2a and the controller 1a, and a column address strobe signal CAS is supplied in parallel to the discriminator 2a and the controller 1b. In the standard data access mode, the row address strobe signal RAS is decayed to an active low level earlier than the column address strobe signal CAS. On the other hand, in order to enter into the self-refreshing mode, the column address strobe signal CAS is firstly decayed to the active low level, and the row address strobe signal RAS follows the column address strobe signal CAS.

FIG. 2 shows a self-refreshing sequence of the prior art dynamic random access memory device, and the self-refreshing sequence is hereinbelow described with co-reference to FIGS. 1 and 2. Assuming now that the column address strobe signal CAS and the row address strobe signal RAS sequentially go down to the active low level at time t1 and time t2, the discriminator 2a acknowledges the request for the self-refresh, and controls a self-refresh sequence with control signals CTL1 and CTL2.

Namely, the discriminator 2a supplies the control signal CTL1 to the controller 2b, and the controller 2b starts an internal timer to time a self-refresh entry period T1.

The discriminator 2a shifts the control signal CTL2 to the low level at time t3, and keeps the control signal CTL2 in the low level in the self-refresh entry period T1. The control signal CTL2 is supplied to the controllers 1a and 1b.

If the self-refresh entry period T1 is expired at time t4, the controller 2b produces a self-refresh entry signal Psr, and the self-refresh entry signal Psr is supplied to the controller 1a. While the row address strobe signal RAS is in the active low level, the dynamic random access memory device remains in the self-refresh mode, and an internal timer incorporated in the controller 2b repeatedly swings a timer signal Pt in a self-refresh execution period T2 between the leading edge of the self-refresh entry signal Psr and the leading edge of the row address strobe signal RAS.

The timer signal Pt is supplied to the discriminator 2a and the controller 1a. Namely, the discriminator 2a shifts the control signal CTL2 in synchronism with the timer signal Pt, and the control signal CTL2 is an in-phase signal to the timer signal Pt. The controller 1a also shifts an activation signal Pras in synchronism with the timer signal Pt, and the activation signal Pras is complementary to the control signal CTL2.

The controller 1a is responsive to the control signal CTL2 of the active high level for producing an internal row address indicative of one of word lines (not shown) at time t5, and shifts a completive signal Pysta to an inactive low level at time t6.

The timer signal Pt is recovered to the low level at time t7, and the control signal CTL2 and the activation signal Pras are complementarily shifted to the inactive low level and the active high level, respectively, at time t8. A refresh row address signal indicative of the internal row address is latched by a row address decoder (not shown), and the row address decoder causes a word line driver (not shown) to energize the selected word line in response to the activation signal Pras. Then, data bits are read out from a row of memory cells (not shown) to bit line pairs (now shown), respectively, and small potential differences are produced on the respective bit line pairs.

The controller 1a shifts a completive signal Pysta to the high level indicative of the completion of latch operation on the refresh row address signal at time t9, and the controller 1c shifts an activation signal Pse to the active high level at time t10. Then, an array of sense amplifiers (not shown) is enabled with the activation signal Pse, and the small potential differences on the bit line pairs are developed or refreshed by the sense amplifiers. The developed potential differences are restored in the memory cells again, and the controller 2b shifts the timer signal Pt to the high level at time t11 again so as to restart the self-refresh sequence.

While the dynamic random access memory device is in the self-refresh mode, the column addressing sub-system is useless, and the control signal CTL2 disables the controller 1b for column addressing. However, the controller 1b is enabled in the standard data access mode, and allows a column address decoder (not shown) to latch a column address signal under the control with the column address strobe signal CAS and the completive signal Pysta.

In detail, FIG. 3 shows the circuit arrangement of the controller 1b and the associated circuits. The controller 1b comprises an enable circuit 11, a disable circuit 12 and a logic circuit 13. The enable circuit 11 is responsive to the completive signal Pysta and the activation signal Pras in the standard data access mode, and the completive signal Pysta of the high level and the activation signal Pras of the high level allows the enable circuit 11 to produce an enable signal Pye. The enable signal Pye is supplied to the logic circuit 13, and the logic circuit 13 becomes responsive to the column address strobe signal CAS of the active low level. When the logic circuit 13 is enabled, the logic circuit 13 produces an internal column address strobe signal Pcasb of the active low level from the column address strobe signal CAS, and supplies the internal column address strobe signal Pcasb to the column addressing sub-system 15. As a result, the column addressing sub-system 15 decodes an column address signal, and selects one of the bit line pairs 16 in the standard data access mode. In other words, an accessed data bit Dread is transferred through the column addressing sub-system 15 to an output circuit 17. The output circuit 17 produces an output data signal Dour from the accessed data bit Dread, and the output data signal Dout is supplied to an input/output pin I/O.

The disable circuit 12 is responsive to the control signal CTL2 and the self-refresh entry signal Psr, and the control signal CTL2 of the high level and the self-refresh entry signal Psr of the high level causes the disable circuit 12 to produce a disable signal Pcd in the self-refresh mode. However, the disable circuit 12 does not produce the disable signal Pcd, because the discriminator 2a does not allow the controller 2b to shift the self-refresh entry signal Psr to the high level. In other words, the disable signal Pcd is never produced in the standard data access mode.

The disable signal Pcd is supplied to the enable circuit 11 in the self-refresh mode, and prohibits the enable circuit 11 from generation of the enable signal Pye. For this reason, the logic circuit 13 is disabled in the self-refresh mode, and does not shift the internal column address strobe signal Pcasb to the active low level. For this reason, the column addressing sub-system 15 does node decode the column address signal, and the output circuit 17 is isolated from the bit line pairs 16 in the self-refresh mode.

Thus, read-out data bits on the bit line pairs 16 are never transferred to the output circuit 17 in the self-refresh mode, and, accordingly, a data output controlling system stands idle.

In detail, the data output controlling system comprises an enable circuit 18, a logic circuit 19 and a controller 20. The enable circuit 18 is enabled with the activation signals Pse and Pras, and produces an enable signal Pseend upon completion of the sense amplification. The logic circuit 19 is enabled with the internal column address strobe signal Pcasb of the low level and with the enable signal Pseend, and produces a primary internal output enable signal from an output enable signal OE of the active low level. The primary internal output enable signal Poeb is supplied to the controller 20, and the controller 20 enables the output circuit 17 with a secondary internal output enable signal EBL at an appropriate timing.

The activation signals Pras and the internal column address strobe signal Pcasb are produced at the respective timings in the standard data access mode, and the controller 20 can enable the output circuit 17 for producing the output data signal Dout.

However, the disable signal Pcd is supplied to the enable circuit 18, and the enable circuit 18 does not produce the enable signal Pseend in the self-refresh mode. For this reason, the controller 20 does not produce the secondary internal output enable signal EBL in the self-refresh mode, and keeps the output circuit 17 in high-impedance state.

FIG. 4 shows the arrangements of the enable circuit 11, the disable circuit 12 and the enable circuit 18 of the data output controlling system. The enable circuit 11 comprises an inverter 11a, a NOR gate 11b, a NAND gate 11c and an inverter 11d, and behaves as follows. The inverter 11a produces a complementary completive signal from the completive signal Pysta, and the complementary completive signal is supplied to the NOR gate 11b. While the disable signal Pcd remains low, the NOR gate 11b is enabled, and inverts the complementary completive signal. While the row addressing sub-system is being activated, the activation signal Pras is in the high level, and the NAND gate 11c shifts the output signal thereof to the low level upon change of the output signal of the NOR gate 11b to the high level. The inverter 11d inverts the output signal of the NAND gate 11c to the high level, and the enable signal Pye allows the logic circuit 13 to respond to the column address strobe signal CAS.

However, while the disable circuit 12 keeps the disable signal Pcd in the high level in the self-refresh mode, the NOR gate 11b keeps the output signal thereof in the low level, and the NAND gate 11c keeps the output signal thereof in the high level. As a result, the enable signal Pye remains in the low level.

The disable circuit 12 comprises an inverter 12a and a NAND gate 12b, and the control signal CTL2 and the self-refresh entry signal Psr are respectively supplied to one of the two input node of the NAND gate 12b and the input node of the inverter 12a. The self-refresh entry signal Psr is kept in the high level in the self-refresh execution period T2, and the NAND gate 12b shifts the disable signal Pcd in the high level regardless of the control signal CTL2.

The enable circuit 18 comprises a NAND gate 18a and a NOR gate 18b. The activation signal Pras is NANDed with the activation signal Pse, and the NOR gate 18b produces the enable signal Pseend in the absence of the disable signal Pcd of the active high level. However, while the disable signal Pcd is in the active high level, the NOR gate keeps the enable signal Pseend in the inactive low level regardless of the activation signals Pse and Pras.

FIG. 5 shows a detailed circuit behavior of the prior art self-refresh controlling system in association with the data output controlling system. Assuming now that column address strobe signal CAS and the row address strobe signal RAS sequentially go down to the active low level at time t11 and at time t12, respectively, the self-refresh controlling system immediately enters into the self-refresh entry period T1, and proceeds to the self-refresh execution period T2 at time t13 as described in conjunction with FIG. 2. In other words, the self-refresh entry signal Psr rises to the high level at time t13.

The self-refresh entry signal Psr is inverted by the inverter 12a of the disable circuit 12, and the NAND gate fixes the disable signal Pcd thereof to the high level.

The disable signal Pcd of the active high level does not allow the NOR gate 11b of the enable circuit 11 and the NOR gate 18b of the enable circuit 18 to keep the output signals thereof in the high level regardless of the activation signal Pras and in the low level regardless of the activation signals Pras and Pse.

The discriminator 2a changes the control signal CTL2 to the high level at time t14 for address increment. However, the NAND gate 12b of the disable circuit 12 does not change the disable signal Pcd to the low level.

The controller 1a changes the activation signal Pras to the active high level at time t15 and the completive signal Pysta to the high level at time t16, and the row addressing sub-system selects one of the word lines assigned the new refresh row address. The word line driver consumes current for energizing the selected word line, and the current consumption of the dynamic random access memory device starts to rise at time t17. However, the NOR gate 11b does not change the output signal thereof, and the NAND gate 11c does not allow the inverter 11d to change the enable signal Pye to the active high level. For this reason, the enable signal Pye is fixed to the inactive low level.

The controller 1c changes the activation signal Pse at time t18, and the sense amplifiers starts to increase the potential differences on the bit line pairs 16. Therefore, the current consumption is further increased. Even though the activation signals Pras and Pse of the high level cause the NAND gate 18a to change the output signal thereof to the low level, the disable signal Pcd keeps the NOR gate 18b disabled, and the enable signal Pseend is maintained at the inactive low level.

The increased potential differences are restored in the memory cells coupled with the selected word line, and the current consumption is minimized at time t19.

The prior art self-refresh controlling system thus arranged disable the data output controlling system and the output circuit 17 in the self-refresh execution period T2, and is desirable for reduction in current consumption. However, a problem is encountered in that a manufacture merely measures a self-refresh cycle for the stored data bits indirectly.

In detail, a manufacturer carries out inspections for the dynamic random access memory devices before delivery from the factory, and guarantees the device characteristics listed in the specification. The self-refresh cycle time is one of the guaranteed device characteristics, and the manufacture needs to measure the self-refresh cycle time. However, the output circuit 17 is disabled in the self-refresh sequence, and can not directly measure the intervals of the self-refresh cycle at the input/output data pin I/O. Presently, the manufacturer measures the time interval Tsr between the peaks of current (see FIG. 5), and estimates the self-refresh cycle time. However, the indirect measure is not exact, and an oscilloscope is additionally required for the inspection.

Japanese Patent Publication of Unexamined Application No. 2-105389 discloses a dynamic random access memory device equipped with a measuring means for the self-refresh cycle time. According to the Japanese Patent Publication of Unexamined Application, the address counter memorizes the number of self-refresh cycles, and the counted number is read out from the address counter to the address pins in the testing sequence. The time period consumed is divided by the number of self-refresh cycles, and the manufacturer considers the average value to be the self-refresh cycle time.

However, the address pins are shared between the addressing in the standard data access mode and the measuring means in the self-refresh mode, and the diagnostic system is expected to discriminate the signals at the address pins. This results in a modification of the diagnostic system. Moreover, any dispersion of the self-refresh cycle time can not be determined with the average value.

SUMMARY OF THE INVENTION

It is therefore an important object of the present invention to provide

To accomplish the object, the present invention proposes to cancel a disable signal to a data output controlling circuit during a test sequence of a self-refresh cycle time or to output an internal control signal incremented in each self-refreshing sequence.

In accordance with the present invention, there is provided a dynamic random access memory device selectively entering into a self-refresh mode and a standard data access mode in response to first and second external control signals, comprising: a) a memory cell array having a plurality of addressable memory cells for storing data bits, a plurality of row addresses and a plurality of column addresses being selectively assigned to the plurality of addressable memory cells; b) a plurality of bit line pairs selectively coupled with the plurality of addressable memory cells, and respectively assigned the plurality of column addresses; c) a row addressing means enabled with a first strobe signal so as to electrically connect selected addressable memory cells assigned the row address indicated by an external row address signal with the plurality of bit line pairs in each standard data accessing sequence of the standard data access mode, the row addressing means further electrically connecting selected addressable memory cells assigned the row address indicated by a refresh row address signal with the plurality of bit line pairs in each self-refreshing sequence of the self-refresh mode; d) a sense amplifying means responsive to a first activation signal for amplifying data bits on the plurality of bit line pairs; e) a column addressing means enabled with a second strobe signal so as to selectively connect the plurality of bit line pairs assigned the column address indicated by an external column address signal with an output circuit, the column addressing means being disabled without the second strobe signal in the self-refresh mode; f) a first controlling means associated with the row addressing means, and responsive to the first external control signal for producing the first strobe signal in the standard data access mode, the first controlling means being further operative to internally produce the refresh row address signal for each self-refreshing sequence in the self-refresh mode; g) a second controlling means associated with the sense amplifying means, and producing the first activation signal under the control of the first controlling means in both standard data access and self-refresh modes; h) a third controlling means associated with the column addressing means, and responsive to the second external control signal for producing the second strobe signal in the standard data access mode, the third controlling means being further operative to produce a disable signal in the self-refresh mode, the third controlling means canceling the second strobe signal in the presence of the disable signal; i) a fourth controlling means associated with the output circuit, and producing a second activation signal in the absence of the disable signal, the output circuit being enabled with the second activation signal for producing an output data signal in the standard data access mode; j) a fifth controlling means responsive to the first and second external control signals for discriminating a request for the self-refresh mode, and supervising the first, third and fourth controlling means in the self-refresh mode; and k) a means responsive to a third external control signal for supplying a periodic signal indicative of a cycle time period of each self-refreshing sequence through the output circuit to a pin.

The means may be implemented by a prohibiting circuit responsive to the third external control signal for preventing the third and fourth controlling means from the disable signal, thereby allowing the third and fourth controlling means to produce the second strobe signal and the second activation signal in the self-refresh mode.

The means may be implemented by a transmitting circuit responsive to the third external control signal for supplying an internal control signal incremented for each self-refreshing sequence through the output circuit to the pin.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figure 6:
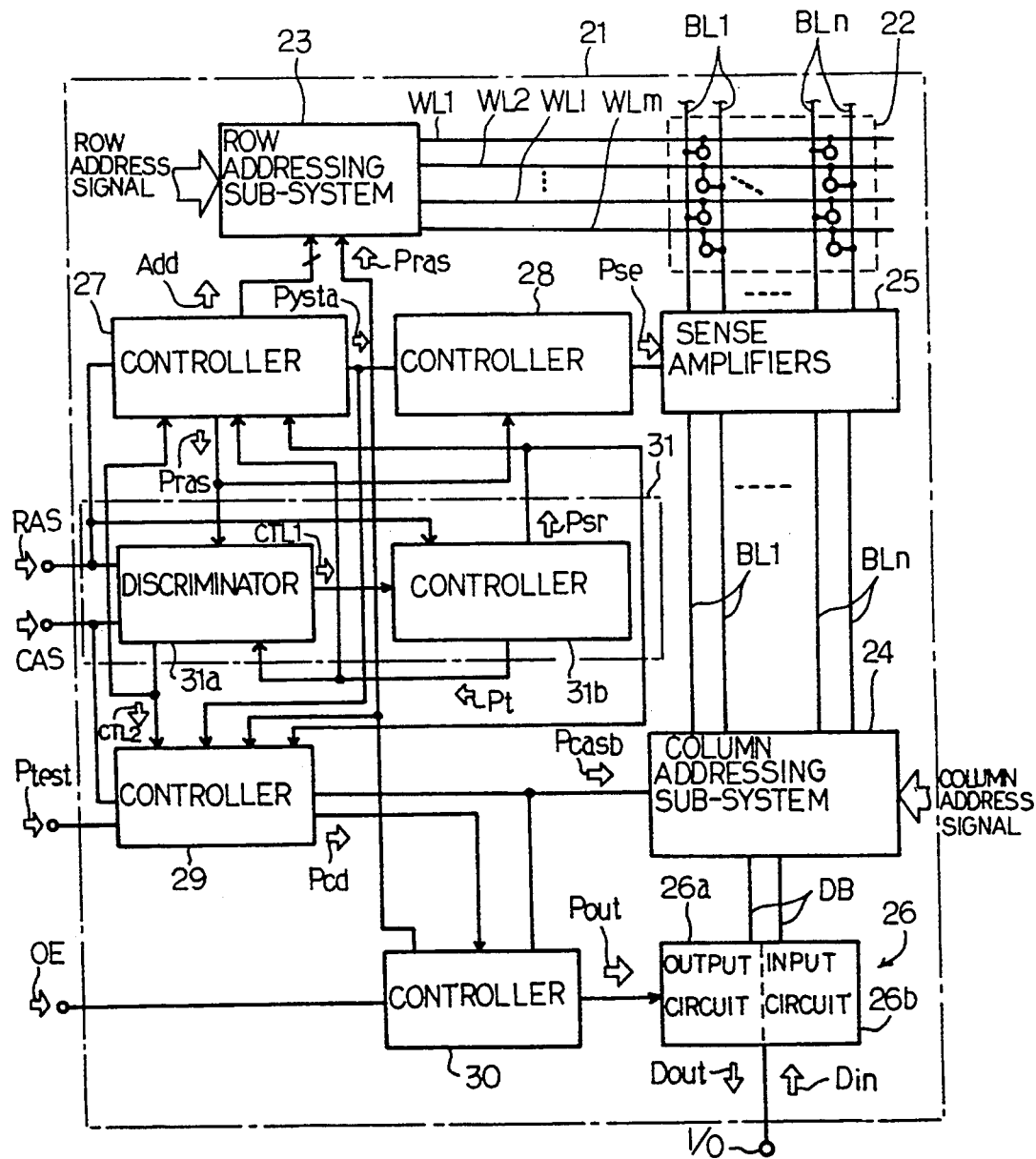
FIG. 6 is a block diagram showing the arrangement of a dynamic random access memory device according to the present invention.

Referring to FIG. 6 of the drawings, a dynamic random access memory device embodying the present invention is fabricated on a semiconductor chip 21, and selectively enters into a standard data access mode and a self-refresh mode. In this instance, the dynamic random access memory device stores data bits and delivers the data bits to an external device in the standard data access mode, and refreshes the data bits already stored therein in the self-refresh mode.

The dynamic random access memory device comprises a memory cell array 22 implemented by memory cells indicated by small circles, and the memory cells are arranged in rows and columns. Though not shown in the drawings, each of the memory cells is of the one-transistor one-capacitor type, and a data bit is stored in the capacitor in the form of electric charge. Row addresses are respectively assigned to the rows of memory cells, and column addresses are respectively assigned to the columns of memory cells.

A plurality of word lines WL1, WL2, ..., WLl and WLm are respectively associated with the rows of memory cells, and switch the transistors of the associated memory cells.

A plurality of bit line pairs BL1 to BLn are respectively associated with the columns of memory cells, and the transistors of the associated columns of memory cells are selectively connected with the bit lines of the associated bit line pairs BL1 to BLn. When a row of memory cells are selected, the capacitors of the selected memory cells are electrically connected with the bit lines, and produce small potential differences on the associated bit line pairs BL1 to BLn, respectively.

The dynamic random access memory device further comprises an addressing system, and the addressing system has a row addressing sub-system 23 and a column addressing sub-system 24.

The row addressing sub-system 23 is enabled with an internal row address strobe signal Pras, and becomes responsive to an internal row address signal produced from an external row address signal in the standard data access mode. The external row address signal is indicative of one of the row addresses, and the row addressing sub-system 23 energizes one of the word lines WL1 to WLm associated with the selected row address. The memory cells assigned the selected row address become accessible, and the capacitors of the selected memory cells are electrically connected with the associated bit lines, respectively. The row addressing sub-system 23 is further responsive to a refresh row address signal Add in the self-refresh mode, and the refresh row address signal Add is indicative of a row address assigned to one of the rows of memory cells. For this reason, the row addressing sub-system 23 and the word lines WL1 to WLm electrically connect the capacitors of the selected row of memory cells with the associated bit lines. In this instance, the row addressing sub-system 23 and the word lines WL1 to WLm as a whole constitute a row addressing means.

The column addressing sub-system 24 is connected between the plurality of bit line pairs BL1 to BLn and a data bus DB, and is enabled with an internal column address strobe signal Pcasb. The column addressing sub-system 24 enabled with the internal column address strobe signal is responsive to an internal column address signal for coupling one of the bit lines BL1 to BLn with the data bus DB. The internal column address signal is produced from an external column address signal, and is indicative of one of the column addresses assigned to one of the columns of memory cells and, accordingly, to one of the bit line pairs BL1 to BLn. The column addressing sub-system 24 serves as a column addressing means.

The dynamic random access memory device further comprises a plurality of sense amplifier circuits 25 respectively connected with the bit line pairs BL1 to BLn, and the sense amplifier circuits 25 is activated with an activation signal Pse for increasing the small potential differences on the associated bit line pairs BL1 to BLn.

The dynamic random access memory device further comprises a data input/output unit 26 coupled between the data bus DB and a data input and output data pin I/O, and the data input/output unit 26 has an output circuit 26a and an input circuit 26b. The output circuit 26a is enabled with an activation signal Pout, and produces an output data signal Dour from the potential difference on the data bus DB in the read-out sequence. On the other hand, the input circuit 26b produces a potential difference from an input data signal Din, and the potential difference is supplied to the data bus DB in the write-in sequence.

Figure 1:
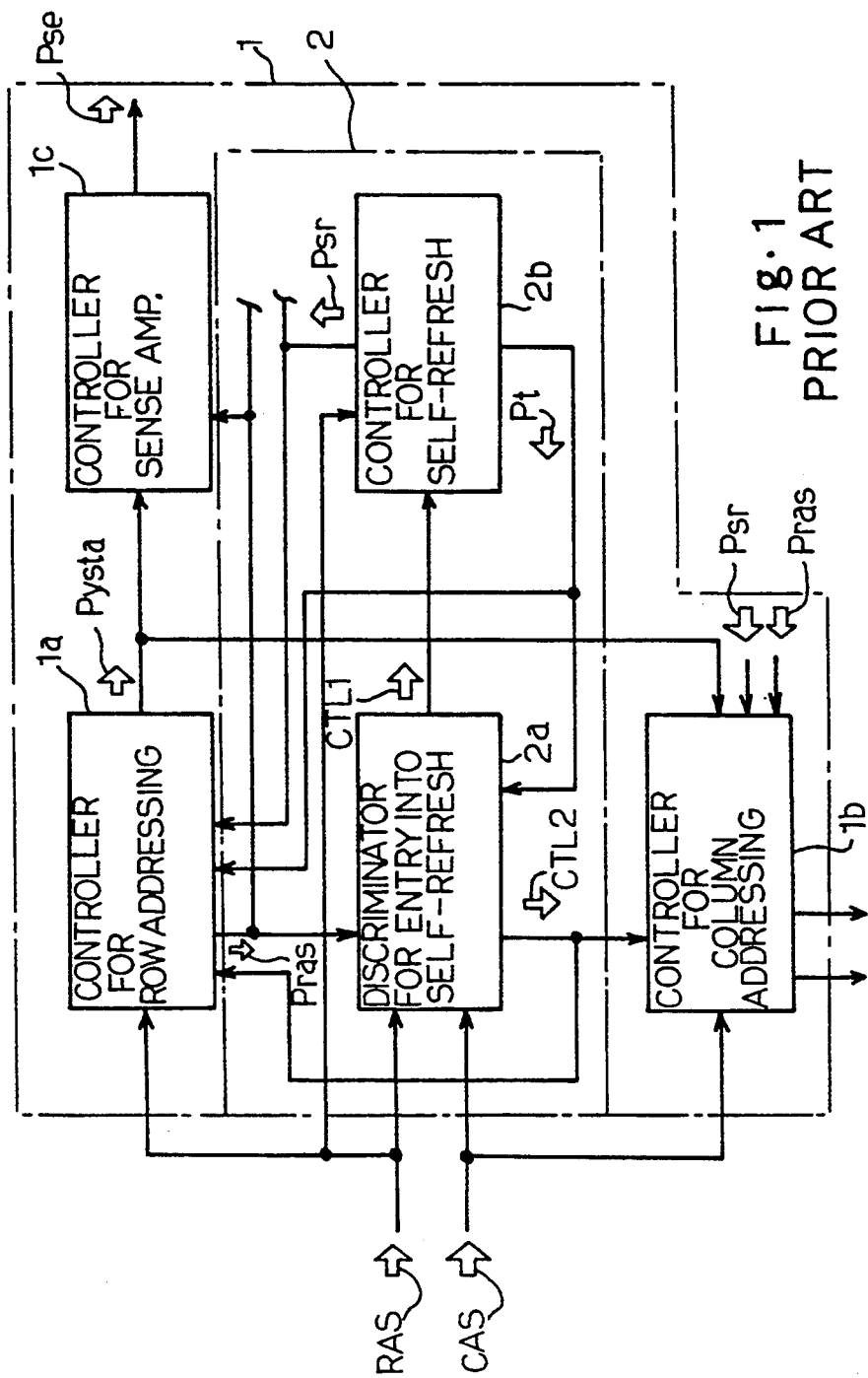
FIG. 1 is a block diagram showing the relation between the prior art refresh controlling system and the timing controlling system.
Figure 2:
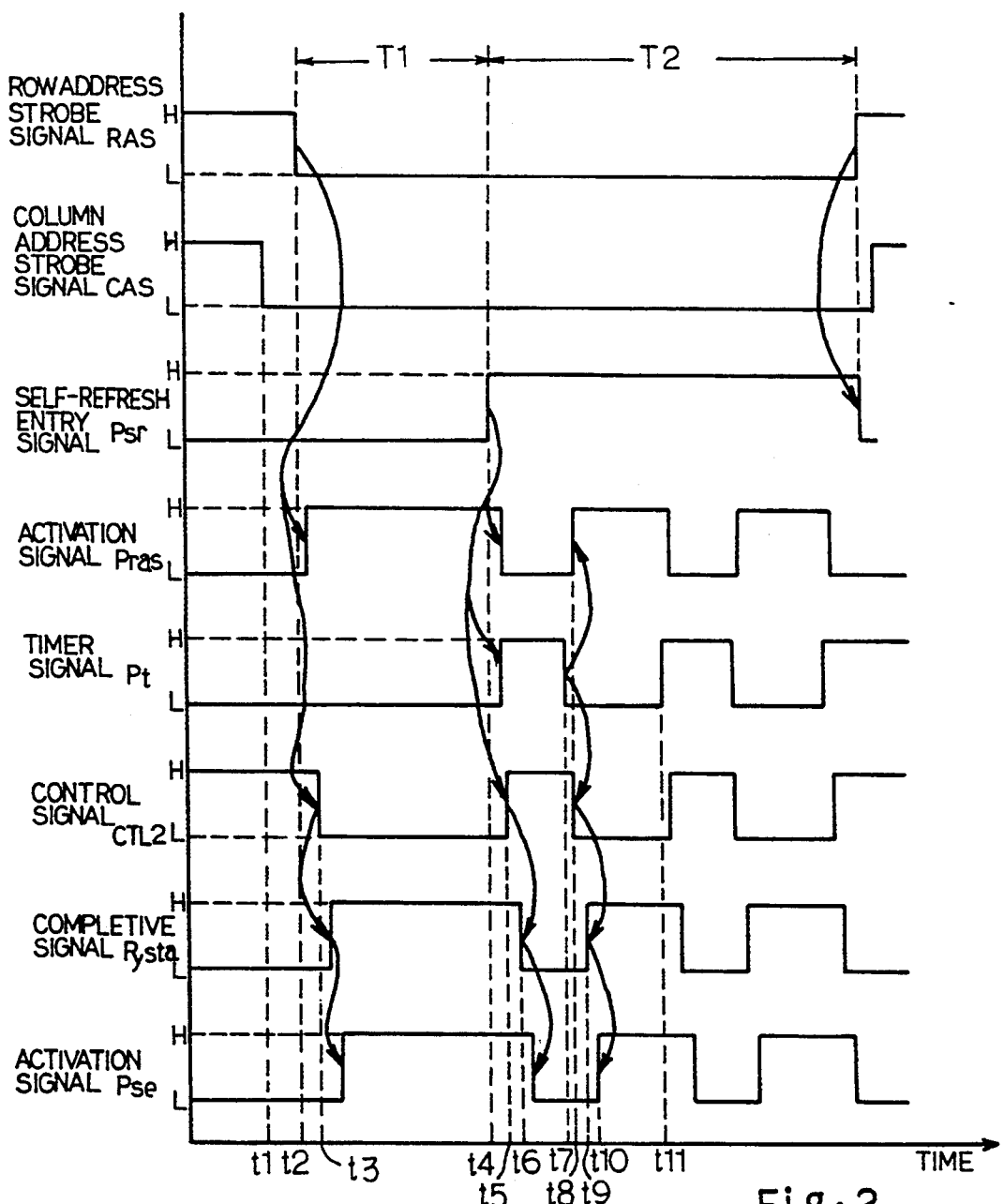
FIG. 2 is a timing chart showing the prior art self-refreshing sequence.

The dynamic random access memory device further comprises five controlling units 27, 28, 29, 30 and 31 respectively serving as first to fifth controlling means and a prohibiting means. The controlling unit 31 is implemented by a discriminator 31a and a controller 31b, and the controlling units 27, 28, the discriminator 31a and the controller 31b are respectively similar in circuit arrangement to the controller 1a, 1c, the discriminator 2a and the controller 2b, and no further description is incorporated for the sake of simplicity. The signals produced therein are labeled with the same references as those shown in FIGS. 1 and 3.

Figure 7:
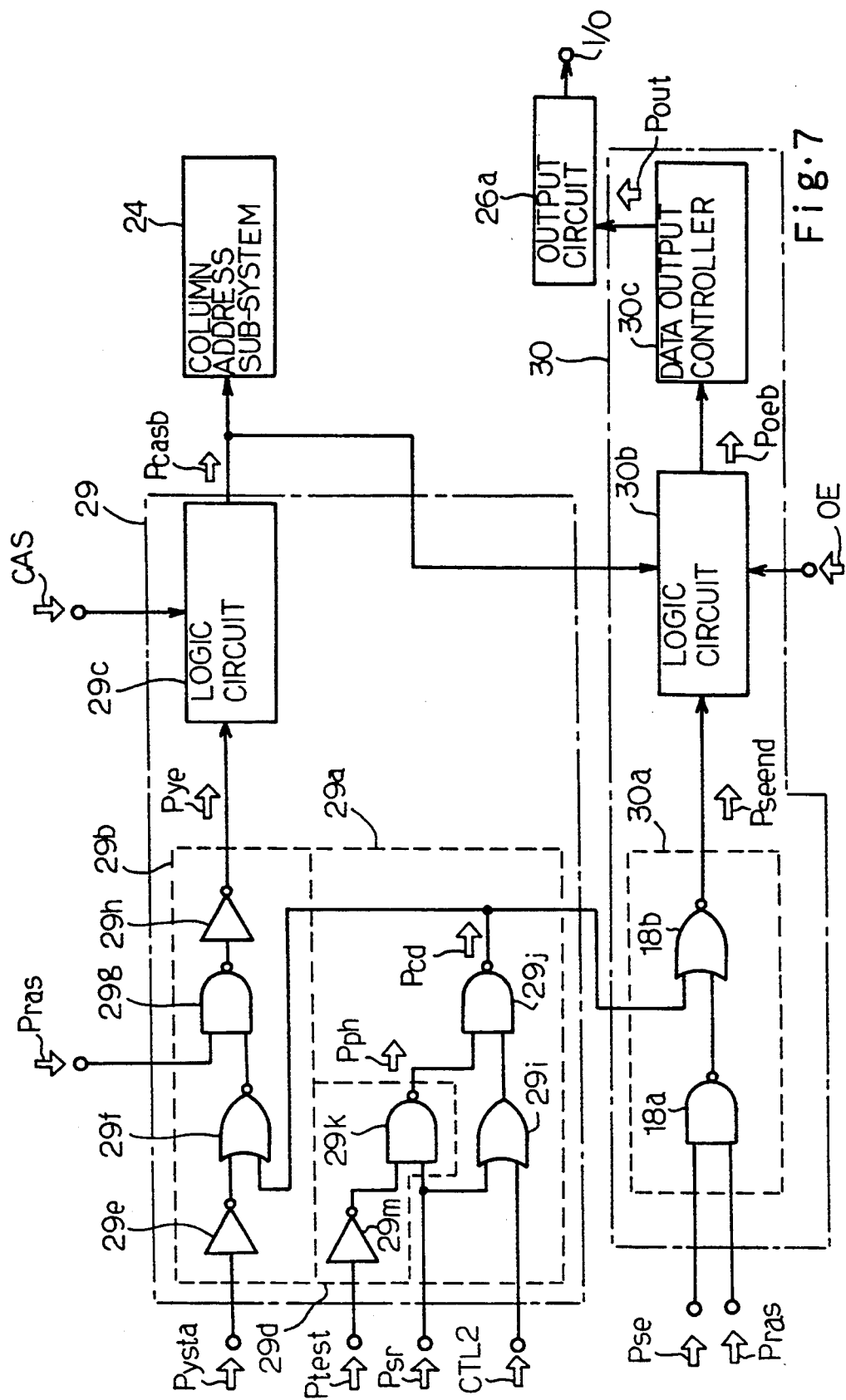
FIG. 7 is a logic diagram showing the arrangements of controlling units incorporated in the dynamic random access memory device.

Turning to FIG. 7 of the drawings, the controlling unit 29 comprises a disable circuit 29a for producing a disable signal Pcd, an enable circuit 29b for producing an enable signal Pye, a logic circuit 29c for producing the internal column address strobe signal Pcasb and a prohibiting circuit 29d for producing a prohibiting signal Pph. The prohibiting circuit 29d serves as a prohibiting means in this instance.

The disable circuit 29a comprises an inverter 29e, a NOR gate 29f, a NAND gate 29g and an inverter 29h. The completive signal Pysta is inverted by the inverter 29e, and the complementary completive signal is NORed with the disable signal Pcd. The output signal of the NOR gate 29f is NANDed with the activation signal Pras, and the inverter 29h produces the enable signal Pye from the output signal of the NAND gate 29g. The logic circuit 29c is enabled with the enable signal Pye for producing the internal column address strobe signal Pcasb from the external column address strobe signal CAS.

However, if the disable circuit 29a changes the disable signal Pcd to the active high level, the NOR gate 29f fixes the output signal thereof to the low level, and the NAND gate 29g keeps the output signal thereof in the high level regardless of the activation signal Pras. As a result, the enable signal Pye remains in the inactive low level, and does not allow the logic circuit 29c to latch the external column address strobe signal CAS.

The disable circuit 29a comprises an OR gate 29i and an NAND gate 29j, and a NAND gate 29k is shared between the disable circuit 29a and the prohibiting circuit 29d. The NAND gate 29k and an inverter 29m forms the prohibiting circuit 29d together with the NAND gate 29k.

The control signal CTL2 is ORed with the self-refresh entry signal Psr, and the output signal of the OR gate 29i is supplied to the NAND gate 29j. The test control signal Ptest is inverted by the inverter 29m, and the complementary test control signal Ptest is NANDed with the self-refresh entry signal Psr for producing the prohibiting signal Pph. While the test control signal Ptest is in the inactive low level, the complementary test control signal enables the NAND gate 29k, and allows the NAND gate 29k to serve as an inverter. In this situation, if the self-refresh entry signal Psr rises to the active high level indicative of the self-refresh execution period T2 in the self-refresh mode, the NAND gate 29k keeps the prohibiting signal Pph in the inactive low level, and the NAND gate 29j produces the disable signal Pcd of the active high level as similar to the prior art controller 1b.

However, if the test control signal Ptest rises to the active high level indicative of the inspection of the self-refresh cycle time, the NAND gate 29k fixes the prohibiting signal Pph to the high level regardless of the self-refresh entry signal Psr, and the self-refresh entry signal Psr of the high level allows the NAND gate 29j to change the disable signal Pcd to the inactive low level. As a result, the enable circuit 29b allows the logic circuit 29c to produce the internal column address strobe signal Pcasb in the self-refresh mode.

Figure 3:
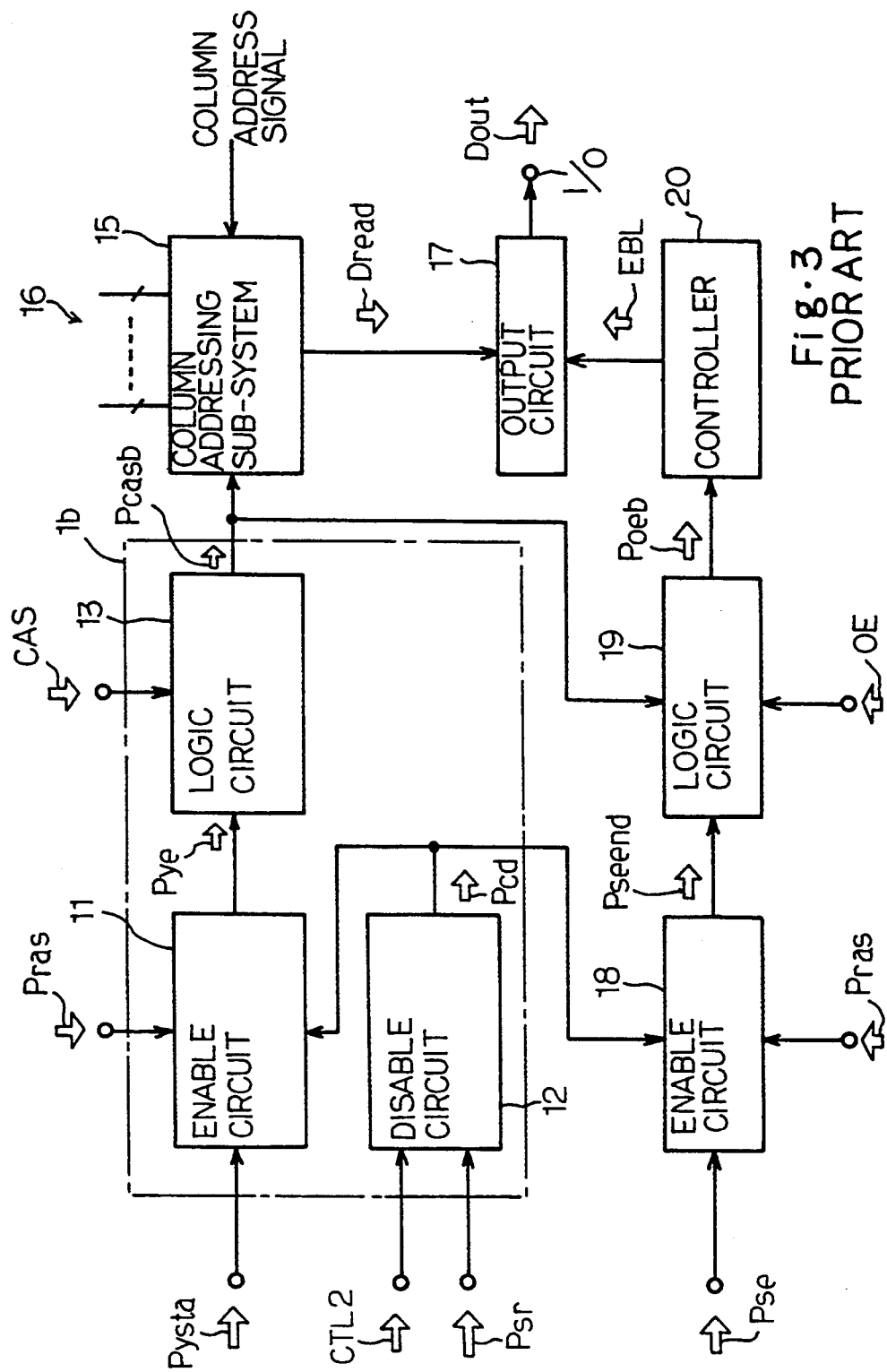
FIG. 3 is a block diagram showing the circuit arrangement between the prior art controller for the column addressing and the associated circuits.
Figure 4:
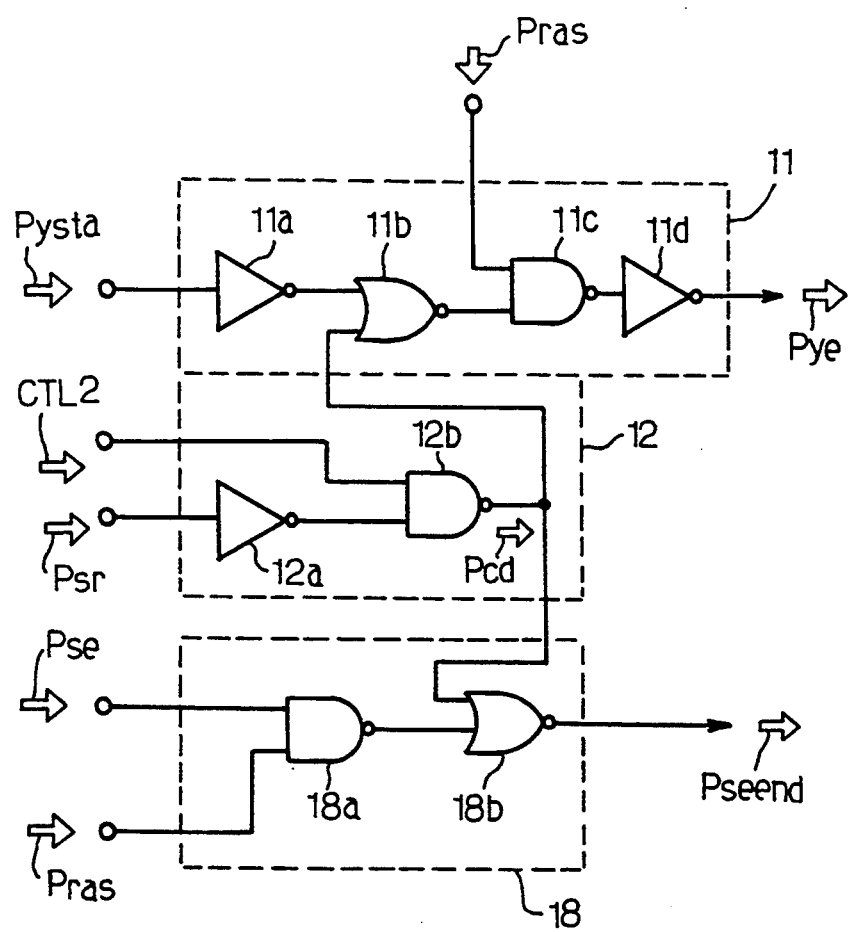
FIG. 4 is a logic diagram showing the circuit arrangements of the enable circuits and the disable circuit incorporated in the prior art dynamic random access memory device.
Figure 5:
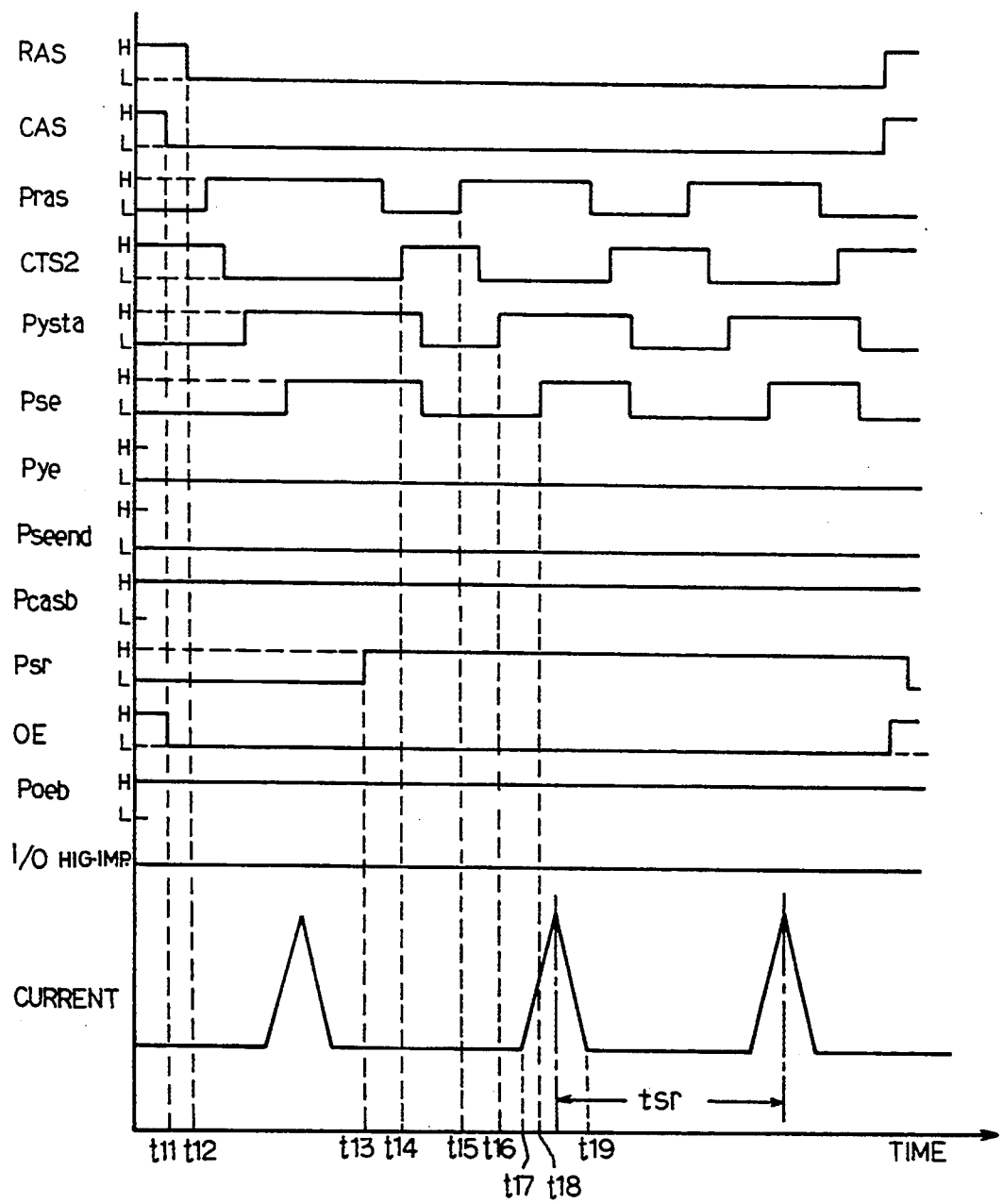
FIG. 5 is a timing chart showing the circuit behavior of the prior art self-refresh controlling system in association with the data output controlling system.

The controlling unit 30 comprises an enable circuit 30a, a logic circuit 30b and a data output controller 30c, and the enable circuit 30a, the logic circuit 30b and the data output controller 30c are similar in circuit arrangement to those shown in FIG. 3, and logic gates of the enable circuit 30a are labeled with the same references as those of the enable circuit 18 without detailed description.

Figure 8:
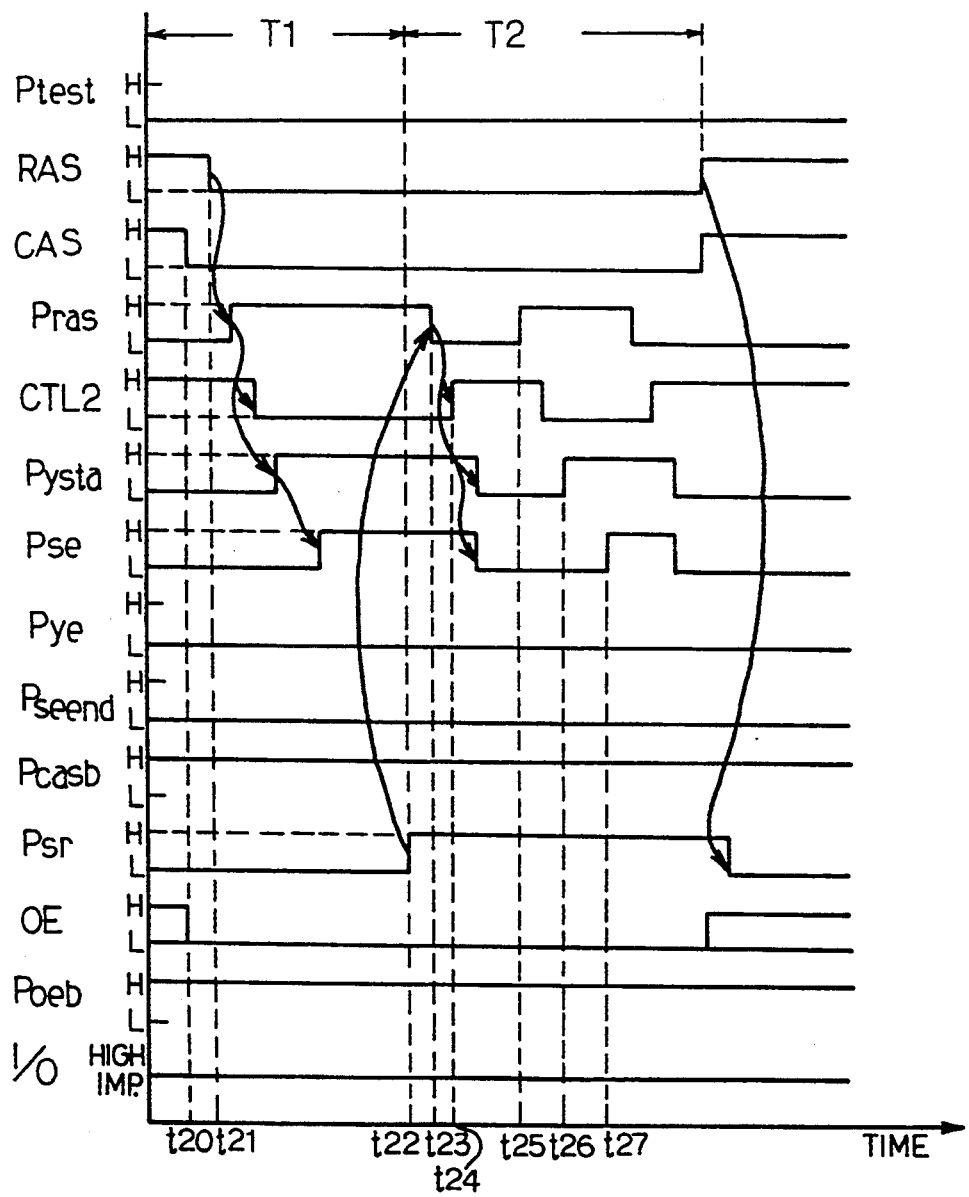
FIG. 8 is a timing chart showing a self-refreshing sequence of the dynamic random access memory device installed in an electronic processing system.

Description is hereinbelow made on the self-refreshing sequence after an installation of the dynamic random access memory device in an electronic data processing system with reference to FIG. 8. The dynamic random access memory device serves as a data storage in the electronic data processing system, and an external data processor write a data bit into and reads out the data bit from the memory cell array 22 through a standard data accessing sequence. However, the standard data accessing sequence is well known to a person skilled in the art, and no further description is incorporated hereinbelow.

Assuming now that the column address strobe signal CAS and the row address strobe signal RAS are sequentially decayed to the active low level at time t20 and at time t21, the discriminator 31a acknowledges a request for the self-refresh, and the controller 31b starts to time the self-refresh entry period T1.

If the self-refresh entry period is expired at time t22, the controller 31b changes the self-refresh entry signal Psr to the active high level, and the activation signal Pras is recovered to the inactive low level at time t23.

The discriminator 31a shifts the control signal CTL2 to the active high level in synchronism with the timer signal Pt at time t24, and the controller 27 increments the refresh row address so as to supply the refresh row address signal Add to the row addressing sub-system 23. The controller 27 shifts the activation signal Pras and the completive signal Pysta to the active high level at time t25 and at time t26, and the row addressing sub-system 23 energizes one of the word lines WL1 to WLm so as to electrically connect the selected row of memory cells with the associated bit lines. Then, small potential differences take place on the bit line pairs BL1 to BLn, and the bit line pairs BL1 to BLn propagate the small potential differences to the sense amplifiers 25.

The controller 28 shifts the activation signal Pse to the active high level at time t27, and the sense amplifiers 25 increase or develop the potential differences on the bit line pairs BL1 to BLn.

The test control signal Ptest remains in the inactive low level after the installation into the electronic processing system. For this reason, when the controller 31b shifts the self-refresh entry signal Psr to the active high level, the NAND gate 29k fixes the prohibiting signal Pph to the inactive low level, and the NAND gate 29j keeps the disable signal Pcd at the active high level. For this reason, the enable signals Pye and Pseend are maintained in the inactive low level, and the logic circuit 29c and the data output controller 30c fixes the internal column address strobe signal Pcasb and the activation signal Pout to the inactive high level regardless of the external column address strobe signal CAS and the external output enable signal OE. For this reason, the column addressing sub-system 24 does not transfer a potential difference to the output circuit 26a, and the output circuit 26a keeps the input and output data pin I/O in the high impedance state.

Thus, the column addressing sub-system 24 and the output circuit 26a do not consume electric current in the self-refresh sequence. However, the potential differences developed by the sense amplifiers 25 are restored in the selected row of memory cells, and the self-refresh sequence is completed.

Figure 9:
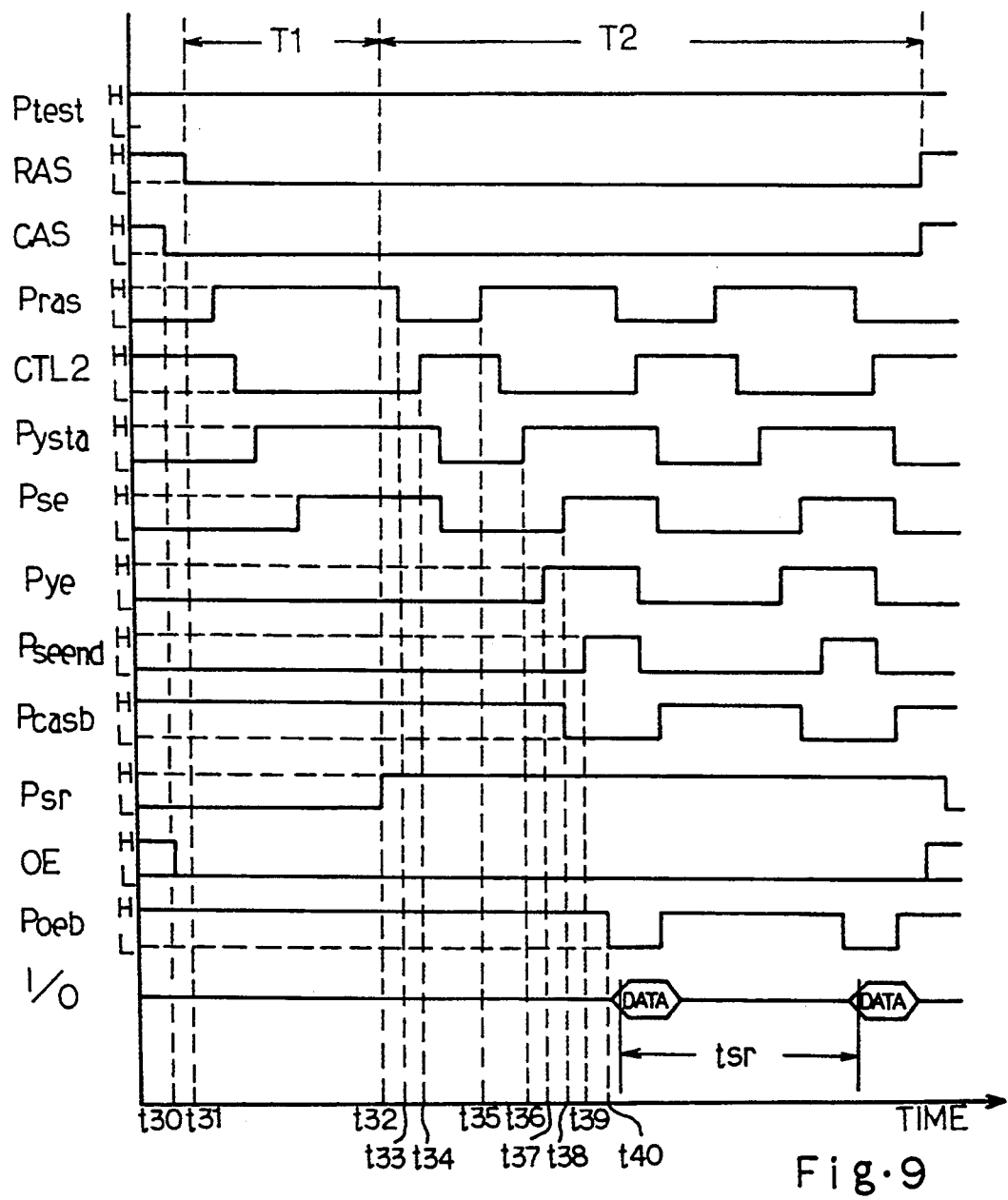
FIG. 9 is a timing chart showing a self-refresh sequence of the dynamic random access memory device in an inspection for a self-refresh cycle time.

The self-refresh cycle time is measured in an inspection before delivery to an user as follows. FIG. 9 shows the self-refreshing sequences carried out in the inspection, and the test control signal Ptest is fixed to the active high level. If the column address strobe signal CAS and the row address strobe signal RAS are sequentially decayed to the active low level at time t30 and at time t31, the discriminator 31a acknowledges a request for the self-refresh, and the controller 31b starts to time the self-refresh entry period T1.

If the self-refresh entry period is expired at time t32, the controller 31b changes the self-refresh entry signal Psr to the active high level, and the activation signal Pras is recovered to the inactive low level at time t33.

The discriminator 31a shifts the control signal CTL2 to the active high level in synchronism with the timer signal Pt at time t34, and the controller 27 increments the refresh row address so as to supply the refresh row address signal Add to the row addressing sub-system 23. The controller 27 shifts the activation signal Pras and the compltive signal Pysta to the active high level at time t35 and at time t36, and the row addressing sub-system 23 energizes one of the word lines WL1 to WLm so as to electrically connect the selected row of memory cells with the associated bit lines. Then, small potential differences take place on the bit line pairs BL1 to BLn, and the bit line pairs BL1 to BLn propagate the small potential differences to the sense amplifiers 25.

The test control signal Ptest causes the disable circuit 29a to keep the disable signal in the inactive low level, and the compltive signal Pysta and the activation signal Pras cause the enable circuit 29b to change the enable signal Pye to the active high level at time t37. Then, the logic circuit 29c is enabled, and shifts the internal column address strobe signal to the active low level at time t38. As a result, the column addressing sub-system 24 becomes responsive to the internal column address signal so that one of the bit line pairs BL1 to BLn is connected with the data bus DB.

The controller 28 shifts the activation signal Pse to the active high level at time t38, and the sense amplifiers 25 increase or develop the potential differences on the bit line pairs BL1 to BLn. The developed potential difference is not only restored in the selected row of memory cells but also transferred through the column addressing sub-system 24 to the data bus DB.

The activation signal Pse of the high level and the activation signal Pras of the high level cause the enable circuit 30a to change the enable signal Pseend to the active high level at time t39 in the absence of the disable signal Pcd. The logic circuit 30b is enabled, and changes the enable signal Poeb to the active low level at time t40. The data output controller 30c supplies the activation signal Pout in the presence of the enable signal Poeb of the low level, and the output circuit 26a supplies the output data signal Dour to the input and output data pin I/O.

The above described self-refresh sequence is repeated for another refresh row address, and the manufacturer determines the self-refresh cycle time on the basis of the time interval Tsr.

As will be appreciated from the foregoing description, the prohibiting circuit 29d allows the column addressing sub-system 24 and the output circuit 26a to sequentially transfer the refreshed data bits to the input and output data pin I/O, and the manufacture can directly measure the self-refresh cycle time at the input and output data pin I/O. This results in that the guaranteed device characteristics are reliable. Moreover, it is unnecessary to prepare an oscilloscope and to remodel the diagnostic system.

Second Embodiment

Figure 10:
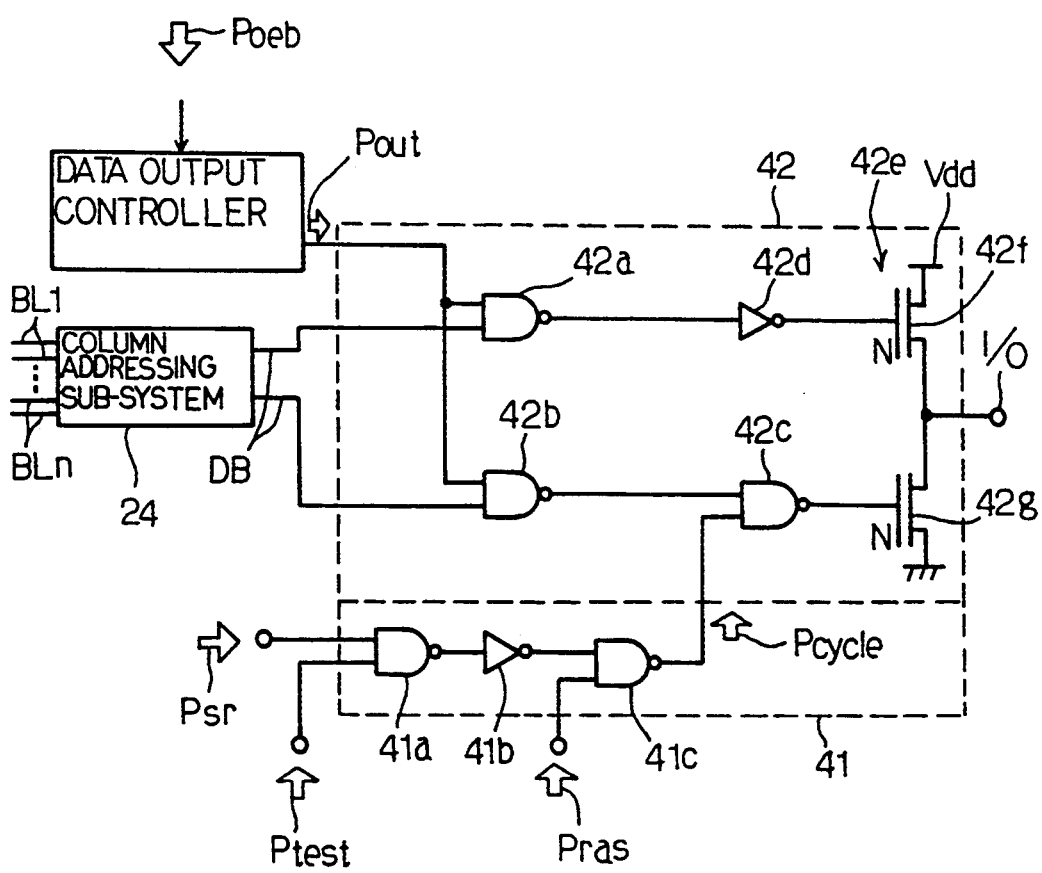
FIG. 10 is a logic diagram showing a prohibiting circuit incorporated in another dynamic random access memory device according to the present invention.

Turning to FIG. 10 of the drawings, a transmitting circuit 41 is associated with an output circuit 42 incorporated in another dynamic random access memory device embodying the present invention. The output circuit 42 is corresponding to the output circuit 26a, and the other units are analogous from those of the first embodiment except for the prohibiting circuit 29d. The prohibiting circuit 29d is replaced with the transmitting circuit 41, and is deleted from the dynamic random access memory device implementing the second embodiment. Detailed description on the other units is omitted for avoiding repetition, and the other units and the signal lines are labeled with the same references as those of the corresponding units of the first embodiment.

The output circuit 42 comprises three NAND gates 42a, 42b and 42c, an inverter 42d and an output driver 42e, and the output driver 42e is implemented by a series combination of n-channel enhancement type field effect transistors 42f and 42g. The NAND gates 42a and 42b are enabled with the activation signal Pout, and are responsive to a potential difference on the data bus DB in the standard data access mode for driving the output driver 42e. The NAND gate 42c is enabled by the transmitting circuit 41 in the standard data access mode, and serves as an inverter.

For example, if the high level and the low level are supplied through the data bus DB to the NAND gates 42a and 42b, the activation signal Pout allows the NAND gates 42a and 42b to invert the high level and the low level, and the inverter 42d and the NAND gate 42c restore the high level and the low level. As a result, the n-channel enhancement type field effect transistors 42f and 42g turn on and off, and the positive high power voltage Vdd is supplied to the input and output data pin I/O.

The transmitting circuit 41 comprises a NAND gate supplied with the self-refresh entry signal Psr and the external test control signal Ptest, an inverter 41b and a NAND gate 41c responsive to the activation signal Pras in the self-refresh execution time period T2 for producing a periodic signal Pcycle. The activation signal Pras has a time interval approximately equal to the cycle time Tsr of each self-refreshing sequence, and NAND gate 41c supplies the periodic signal Pcycle indicative of the cycle time Tsr to the NAND gate 42c.

In this instance, the activation signal Pras is supplied to the transmitting circuit. However, the timer signal Pt or the control signal CTL2 may be supplied to the transmitting circuit, because these signals also have time intervals approximately equal to the cycle time Tsr.

Figure 11:
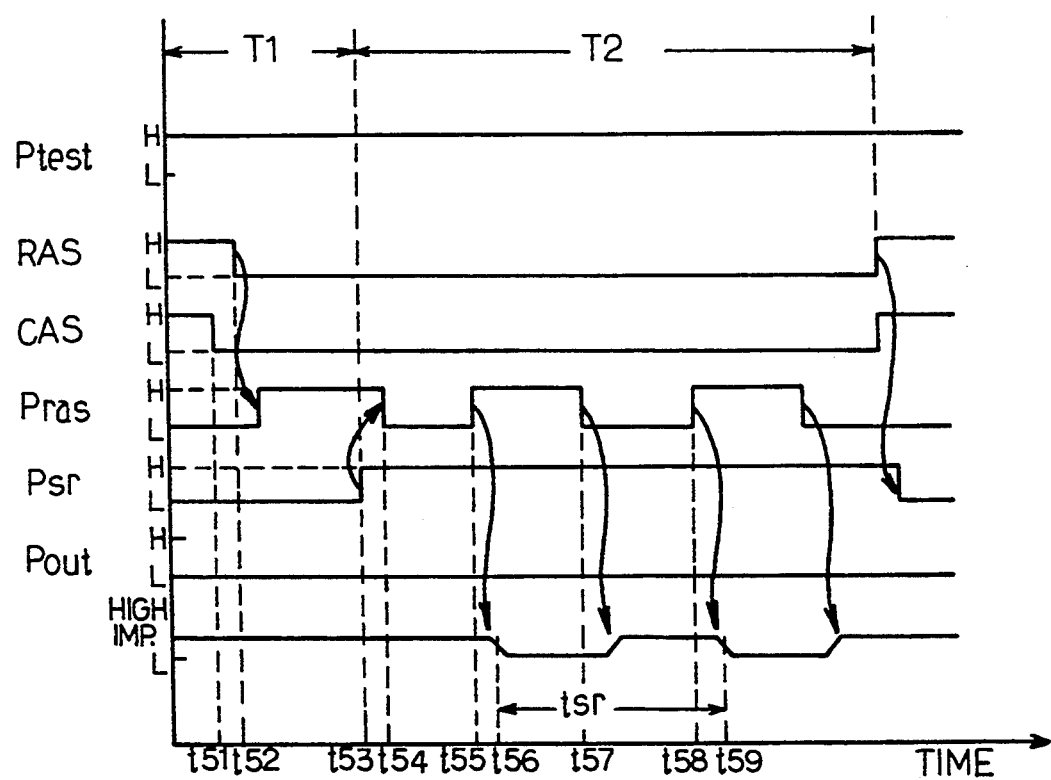
FIG. 11 is a timing chart showing a self-refresh sequence of the dynamic random access memory device shown in FIG. 10.

Description is hereinbelow made on the circuit behavior of the transmitting circuit 41 with reference to FIG. 11. In order to directly measure the self-refresh cycle time Tsr, the test control signal Ptest is fixed to the high level.

Assuming now that the column address strobe signal CAS and the row address strobe signal RAS are sequentially decayed to the active low level at time t51 and at time t52, respectively, the discriminator 31a acknowledges a request for the self-refresh, and the dynamic random access memory device enters into the self-refresh execution period T2 after the self-refresh entry period T1 as similar to the first embodiment.

In the self-refresh execution period T2, the controller 29 fixes the disable signal Pcd to the active high level, and the controller 29 and the controller 30 disable the column addressing sub-system 24 and the output circuit 42. For this reason, the activation-signal Pout is fixed to the inactive low level, and the NAND gates 42a and 42b keep the output signals thereof in the high level. The inverter 42d keeps the n-channel enhancement type field effect transistor 42f in the off-state, and the NAND gate 42c is enabled.

If the self-refresh entry period T1 is expired at time t53, the controller 27 shifts the activation signal Pras to the inactive low level at time t54, and increments the refresh row address in synchronism with the control signal CTL2. The controller 27 shifts the activation signal Pras at time t55 so as to activate the row addressing sub-system 23, and data bits are refreshed through the sense amplification by the column addressing subsystem 24.

When the self-refresh entry signal Psr rises to the high level, the NAND gate 41a supplies the low level to the inverter 41b, and the inverter 41b enables the NAND gate 41c with the output signal of the high level. For this reason, the activation signal Pras of the high level allows the NAND gate 41c to shift the periodic signal Pcycle to the low level, and the NAND gate 42c supplies the high level to the gate electrode of the n-channel enhancement type field effect transistor 42g. The n-channel enhancement type field effect transistor 42g turns on, and the input and output data pin I/O is changed from the high impedance state to the low level at time t56.

The controller 27 recovers the activation signal to the inactive low level at time t57, and the input and output data pin I/O enters into the high impedance state again. The refresh row address is incremented in synchronism with the control signal CTL2, and the controller 27 changes the activation signal Pras to the active high level at time t58. The NAND gate 41c changes the periodic signal Pcycle to the low level, and the NAND gate 42c allows the n-channel enhancement type field effect transistor 42g to turn on again. As a result, the input and output data pin I/O becomes the low level at time t59, and the time interval between times t56 and t59 is indicative of the self-refresh cycle time Tsr.

Although particular embodiments of the present invention have been shown and described, it will be obvious to those skilled in the art that various changes and modifications may be made without departing from the spirit and scope of the present invention. For example, a pin may be shared between the test control signal and another external signal, and the dynamic random access memory device may form a part of an ultra large scale integration together with other function blocks.

What is claimed is:

1. A dynamic random access memory device selectively entering into a self-refresh mode and a standard data access mode in response to first and second external control signals, comprising:

a) a memory cell array having a plurality of addressable memory cells for storing data bits, a plurality of row addresses and a plurality of column addresses being selectively assigned to said plurality of addressable memory cells;

b) a plurality of bit line pairs selectively coupled with said plurality of addressable memory cells, and respectively assigned said plurality of column addresses;

c) a row addressing means enabled with a first strobe signal so as to electrically connect selected addressable memory cells assigned the row address indicated by an external row address signal with said plurality of bit line pairs in each standard data accessing sequence of said standard data access mode, said row addressing means further electrically connecting selected addressable memory cells assigned the row address indicated by a refresh row address signal with said plurality of bit line pairs in each self-refreshing sequence of said self-refresh mode;

d) a sense amplifying means responsive to a first activation signal for amplifying data bits on said plurality of bit line pairs;

e) a column addressing means enabled with a second strobe signal of an active level so as to selectively connect said plurality of bit line pairs assigned the column address indicated by an external column address signal with an output circuit, said column addressing means being disabled in the absence of said second strobe signal of said active level in said self-refresh mode;

f) a first controlling means associated with said row addressing means, and responsive to said first external control signal for producing said first strobe signal in said standard data access mode, said first controlling means being further operative to internally produce said refresh row address signal incremented for said each self-refresh sequence in said self-refresh mode;

g) a second controlling means associated with said sense amplifying means, and producing said first activation signal under the control of said first controlling means in both standard data access and self-refresh modes;

h) a third controlling means associated with said column addressing means, and responsive to said second external control signal for producing said second strobe signal of said active level in said standard data access mode, said third controlling means being further operative to produce a disable signal in said self-refresh mode, said third controlling means canceling said second strobe signal of said active level in the presence of said disable signal;

i) a fourth controlling means associated with said output circuit, and producing a second activation signal in the absence of said disable signal, said output circuit being enabled with said second activation signal for producing an output data signal in said standard data access mode;

j) a fifth controlling means responsive to said first and second external control signals for discriminating a request for said self-refresh mode, and supervising said first, third and fourth controlling means in said self-refresh mode; and k) a means responsive to a third external control signal for supplying a periodic signal indicative of a cycle time period of each self-refreshing sequence through said output circuit to a pin.

2. A dynamic random access memory device selectively entering into a self-refresh mode and a standard data access mode in response to first and second external control signals, comprising:

a) a memory cell array having a plurality of addressable memory cells for storing data bits, a plurality of row addresses and a plurality of column addresses being selectively assigned to said plurality of addressable memory cells;

b) a plurality of bit line pairs selectively coupled with said plurality of addressable memory cells, and respectively assigned said plurality of column addresses;

c) a row addressing means enabled with a first strobe signal so as to electrically connect selected addressable memory cells assigned the row address indicated by an external row address signal with said plurality of bit line pairs in each standard data accessing sequence of said standard data access mode, said row addressing means further electrically connecting selected addressable memory cells assigned the row address indicated by a refresh row address signal with said plurality of bit line pairs in each self-refreshing sequence of said self-refresh mode;

d) a sense amplifying means responsive to a first activation signal for amplifying data bits on said plurality of bit line pairs;

e) a column addressing means enabled with a second strobe signal of an active level so as to selectively connect said plurality of bit line pairs assigned the column address indicated by an external column address signal with an output circuit, said column addressing means being disabled in the absence of said second strobe signal of said active level in said self-refresh mode;

f) a first controlling means associated with said row addressing means, and responsive to said first external control signal for producing said first strobe signal in said standard data access mode, said first controlling means being further operative to internally produce said refresh row address signal incremented for said each self-refresh sequence in said self-refresh mode;

g) a second controlling means associated with said sense amplifying means, and producing said first activation signal under the control of said first controlling means in both standard data access and self-refresh modes;

h) a third controlling means associated with said column addressing means, and responsive to said second external control signal for producing said second strobe signal of said active level in said standard data access mode, said third controlling means being further operative to produce a disable signal in said self-refresh mode, said third controlling means canceling said second strobe signal of said active level in the presence of said disable signal;

i) a fourth controlling means associated with said output circuit, and producing a second activation signal in the absence of said disable signal, said output circuit being enabled with said second activation signal for producing an output data signal in said standard data access mode;

j) a fifth controlling means responsive to said first and second external control signals for discriminating a request for said self-refresh mode, and supervising said first, third and fourth controlling means in said self-refresh mode; and k) a prohibiting means responsive to a third external control signal for preventing said third and fourth controlling means from said disable signal, thereby allowing said third and fourth controlling means to produce said second strobe signal of said active level and said second activation signal in said self-refresh mode.

3. The dynamic random access memory device as set forth in claim 2, in which said third controlling means comprises a first enable circuit operative to produce a first enable signal after said refresh row address signal is supplied to said row addressing means so as to become responsive to said second external control signal for producing said second strobe signal of said active level in the absence of said disable signal, and a disable circuit for producing said disable signal in the absence of a prohibiting signal in the self-refresh mode, and supplying said disable signal to said first enable circuit, said prohibiting circuit being responsive to said third external control signal for producing said prohibiting signal.

4. The dynamic random access memory device as set forth in claim 3, in which said first enable circuit comprises a first inverter having an input node supplied with a first internal control signal indicative of completion of latching operation on said refresh row address signal, a first NOR gate having an input node coupled with the output node of said first inverter and another input node supplied with said disable signal, a first NAND gate having an input node coupled with the output node of said first NOR gate and another input node supplied with said first strobe signal, and a second inverter having an input node coupled with the output node of said first NAND gate, said disable circuit comprising an OR gate having input nodes supplied with a second internal control signal indicative of an increment of said refresh row address signal and with a third internal control signal indicative of entry into a self-refresh execution period, and a second NAND gate having an input node coupled with the output node of said OR gate and another input node supplied with said prohibiting signal, said prohibiting circuit comprising a third inverter having an input node supplied with said third external control signal, and a third NAND gate having an input node coupled with the otput node of siad third inverter and another input node supplied with said third internal control signal for producing said prohibiting signal.

5. The dynamic random access memory device as set forth in claim 4, in which said fourth controlling means comprises a second enable circuit having
- a fourth NAND gate supplied with said first activation siganl and said first strobe signal, and
- a second NOR gate having input nodes coupled with the output node of said fourth NAND gate and with the output node of said second NAND gate for producing a second enable signal, said forth controlling means being allowed to produced siad second activation siganl in the presence of said second enable signal.

6. A dynamic random access memory device selectively entering into a self-refresh mode and a standard data access mode in response to first and second external control signals, comprising:

a) a memory cell array having a plurality of addressable memory cells for storing data bits, a plurality of row addresses and a plurality of column addresses being selectively assigned to said plurality of addressable memory cells;

b) a plurality of bit line pairs selectively coupled with said plurality of addressable memory cells, and respectively assigned said plurality of column addresses;

c) a row addressing means enabled with a first strobe signal so as to electrically connect selected addressable memory cells assigned the row address indicated by an external row address signal with said plurality of bit line pairs in each standard data accessing sequence of said standard data access mode, said row addressing means further electrically connecting selected addressable memory cells assigned the row address indicated by a refresh row address signal with said plurality of bit line pairs in each self-refreshing sequence of said self-refresh mode;

d) a sense amplifying means responsive to a first activation signal for amplifying data bits on said plurality of bit line pairs;

e) a column addressing means enabled with a second strobe signal of an active level so as to selectively connect said plurality of bit line pairs assigned the column address indicated by an external column address signal with an output circuit, said column addressing means being disabled in the absence of said second strobe signal of said active level in said self-refresh mode;

f) a timing controlling system having f-1) a first controlling means associated with said row addressing means, and responsive to said first external control signal for producing said first strobe signal in said standard data access mode, said first controlling means being further operative to internally produce said refresh row address signal incremented for said each self-refresh sequence in said self-refresh mode, f-2) a second controlling means associated with said sense amplifying means, and producing said first activation signal under the control of said first controlling means in both standard data access and self-refresh modes, f-3) a third controlling means associated with said column addressing means, and responsive to said second external control signal for producing said second strobe signal of said active level in said standard data access mode, said third controlling means being further operative to produce a disable signal in said self-refresh mode, said third controlling means canceling said second strobe signal of said active level in the presence of said disable signal, f-4) a fourth controlling means associated with said output circuit, and producing a second activation signal in the absence of said disable signal, said output circuit being enabled with said second activation signal for producing an output data signal in said standard data access mode, and f-5) a fifth controlling means responsive to said first and second external control signals for discriminating a request for said self-refresh mode, and supervising said first, third and fourth controlling means in said self-refresh mode; and g) a transmitting means responsive enabled with a third external control signal in said-self-refresh mode, and responsive to a first internal control signal produced in said timing controlling system and indicative of a time interval of each self-refreshing sequence for producing a second internal control signal, said output circuit being responsive to said second internal control signal in said self-refresh mode for changing status of a data pin in synchronism with said second internal control signal.

7. The dynamic random access memory device as set forth in claim 6, in which said output circuit comprises
- a first NAND gate having an input node supplied with said second activation signal and another input node coupled with an output node of said column addressing means,
- a second NAND gate having an input node supplied with said second activation signal and another input node coupled with another output node of said column addressing means,
- a first inverter having an input node coupled with the output node of said first NAND gate,
- a third NAND gate having an input node coupled with the output node of said second NAND gate and another input node supplied with said second internal control signal, and
- a complementary inverter having two input nodes coupled with the output node of said first inverter and with the output node of said third NAND gate, and allowing said data pin to enter into one of a high voltage level, a low voltage level and high-impedance state.

8. The dynamic random access memory device as set forth in claim 7, in which said transmitting circuit comprises
- a fourth NAND gate having input nodes supplied with said third external control signal and a third internal control signal indicative of a self-refresh execution period in said self-refresh mode,
- a second inverter having an input node coupled with the output node of said fourth NAND gate, and
- a fifth NAND gate having an input node coupled with the output node of said second inverter, another input node supplied with said first internal control signal and an output node coupled with said another input node of said third NAND gate.

* * * * *

UNITED STATES PATENT AND TRADEMARK OFFICE
CERTIFICATE OF CORRECTION

PATENT NO. : 5,418,754
DATED : May 23, 1995
INVENTOR(S) : Kenichi Sakakibara

It is certified that error appears in the above-indentified patent and that said Letters Patent is hereby corrected as shown below:

Col. 3, line 7, delete "Dour" and insert --Dout--.

Col. 3, line 28, delete "node" and insert --not--.

Col. 9, line 1, delete "Dour" and insert --Dout--.

Col. 12, line 4, delete "Dour" and insert --Dout--.

Col. 16, line 67, delete "otput" and insert --output--.

Col. 17, line 7, delete "siganl" and insert --signal--.

Col. 17, line 11, delete "forth" and insert --fourth--.

Col. 17, line 12, delete "siad" and insert --said--.

Col. 17, line 13, delete "siganl" and insert --signal--.

Signed and Sealed this

Fourteenth Day of May, 1996

Attest:

BRUCE LEHMAN

*Attesting Officer*     *Commissioner of Patents and Trademarks*